(12) United States Patent
Lee et al.

(10) Patent No.: US 11,315,807 B2
(45) Date of Patent: Apr. 26, 2022

(54) SUBSTRATE PRESSING MODULE, SUBSTRATE PRESSING METHOD, SUBSTRATE TREATING APPARATUS INCLUDING THE SUBSTRATE TREATING MODULE, AND THE SUBSTRATE TREATING METHOD

(71) Applicant: SEMIgear, Inc., Wakefield, MA (US)

(72) Inventors: Suncheol Lee, Seoul (KR); Jaeho Park, Seoul (KR)

(73) Assignee: SEMIgear, Inc., Wakefield, MA (US)

( * ) Notice: Subject to any disclaimer, the term of this patent is extended or adjusted under 35 U.S.C. 154(b) by 281 days.

(21) Appl. No.: 16/387,501

(22) Filed: Apr. 17, 2019

(65) Prior Publication Data
US 2019/0348308 A1    Nov. 14, 2019

(30) Foreign Application Priority Data

May 9, 2018    (KR) .......................... 10-2018-0053195

(51) Int. Cl.
*H01L 21/67*    (2006.01)
*H01L 21/304*    (2006.01)

(52) U.S. Cl.
CPC ...... *H01L 21/67092* (2013.01); *H01L 21/304* (2013.01)

(58) Field of Classification Search
None
See application file for complete search history.

(56) References Cited

U.S. PATENT DOCUMENTS

2017/0256753 A1*  9/2017  Ryu ................... H01L 21/6831
2019/0189593 A1*  6/2019  Kim .................. H01L 21/67092

FOREIGN PATENT DOCUMENTS

| CN | 1841167 A | 10/2006 |
| CN | 107151782 A | 9/2017 |
| JP | 2001-274226 A | 10/2001 |
| KR | 10-2006-0036846 A | 5/2006 |
| KR | 10-2007-0038476 A | 4/2007 |
| KR | 10-0834022 B1 | 5/2008 |
| KR | 10-2016-0057585 A | 5/2016 |
| KR | 10-1739969 B1 | 6/2017 |
| TW | 200401928 A | 2/2004 |
| TW | 201802301 A | 1/2018 |

* cited by examiner

*Primary Examiner* — Jay C Chang
(74) *Attorney, Agent, or Firm* — Park, Kim & Suh, LLC

(57) ABSTRACT

Disclosed is an apparatus for applying a force to a partial area of a substrate. The substrate pressing module includes a support member configured to support the substrate, a weight member provided to be positioned on the partial area of the substrate positioned on the support member and having a specific weight or more, and a pressing unit configured to apply a force to the weight member from the upper side.

10 Claims, 7 Drawing Sheets

SUBSTRATE PRESSING MODULE, SUBSTRATE PRESSING METHOD, SUBSTRATE TREATING APPARATUS INCLUDING THE SUBSTRATE TREATING MODULE, AND THE SUBSTRATE TREATING METHOD

CROSS-REFERENCE TO RELATED APPLICATIONS

This application claims priority under 35 U.S.C. § 119 to Korean Patent Application No. 10-2018-0053195 filed on May 9, 2018, in the Korean Intellectual Property Office, the disclosures of which are incorporated by reference herein in their entireties.

BACKGROUND

Embodiments of the inventive concept described herein relate to to an apparatus and a method for managing a warpage of a substrate by pressing the substrate.

As the integrity of semiconductor devices increases, the patterns of the semiconductor devices become finer. In order to integrate fine patterns, a semiconductor device includes multilayered fine patterns, and includes a contact for connecting the interlayered fine patterns.

The semiconductor integrated circuit generally is a very small and thin silicon chip but includes various electronic parts, and various manufacturing processes including a photographing process, an etching process, and a deposition process to manufacture one semiconductor chip.

Accordingly, in order to manufacture a semiconductor device, a warpage phenomenon may occur due to different thermal expansion rates of various materials while the materials are deposited on a semiconductor substrate, such as a wafer. Due to this, during a heat treatment process such as a bake process, a bump provided on a wafer is melt less or excessively for areas of the wafer as heat is not transferred to the wafer uniformly, causing a defect.

SUMMARY

Embodiments of the inventive concept provide an apparatus and a method for preventing and improving a warpage of a substrate.

Embodiments of the inventive concept also provide an apparatus and a method for uniformly transferring heat to a substrate.

Embodiments of the inventive concept also provide an apparatus and a method for minimizing a defect rate of a substrate.

The technical objects of the inventive concept are not limited to the above-mentioned ones, and the other unmentioned technical objects will become apparent to those skilled in the art from the following description.

The inventive concept provides a substrate pressing module that applies a force to a partial area of a substrate from the upper side. The substrate pressing module includes a support member configured to support the substrate, a weight member provided to be positioned on the partial area of the substrate positioned on the support member and having a specific weight or more, and a pressing unit configured to apply a force to the weight member from the upper side.

The pressing unit may include a protrusion provided above the weight member and protruding downwards to face the weight member, and a driving member configured to move at least one of the protrusion or the support member upwards and downwards between a spacing location and a pressing location, the spacing location may be a location at which the protrusion and the weight member are spaced apart from each other along an upward/downward direction, and the pressing location may be a location at which a lower end of the protrusion and an upper surface of the weight member contact each other such that a force is applied to the upper surface of the weight member by the protrusion.

The protrusion may be fixed, and the driving member may move the support member upwards and downwards.

The partial area may be a peripheral area of the substrate, and the weight member may have a ring shape, a bottom surface of which faces the partial area.

The substrate pressing module may further include an adapter member located between the protrusion and the support member, and the adapter member is provided to support the weight member on the substrate.

The adapter member may include a ring-shaped body, an inner diameter of which is greater than the diameter of the substrate, and three or more support pins protruding inwards from the body and provided along a circumferential direction of the body, a step protruding inwards may be provided at a lower end of an inner surface of the body, an outer diameter of the weight member may be greater than an inner diameter of the step and may be smaller than a diameter of the inner surface of the body, the substrate may be positioned on the support pins, the step may be provided such that the weight member is positioned on the substrate, and the support member may have a diameter that is smaller than the inner diameter of the body and is equal to or greater than the diameter of the substrate and insertion recesses, into which the support pins are inserted downwards, are formed on the upper surface of the support member.

A plurality of protrusions may be combined with each other to form a ring shape along a circumferential direction of the weight member.

The protrusion may be a spring plunger.

An adjustment recess that is recessed inwards may be formed in an area of the upper surface of the weight member, which includes a facing area that faces the protrusion, a depth adjusting member may be inserted into the adjustment recess to be engaged with the adjustment recess, the depth adjusting member may include a first adjusting member and a second adjusting member that are provided in the adjustment recesses to be replaced with each other, and heights of corresponding areas of the first adjusting member and the second adjusting member, which correspond to the facing areas, may be different in a state in which the first adjusting member and the second adjusting member are inserted into the adjustment recesses.

The adjustment recesses may be provided to extend to an inner surface of the weight member, and the depth adjusting member may have a shape, in which a height of the corresponding areas is lower than the height of the areas, except for the corresponding areas.

The inventive concept provides a substrate treating apparatus. The substrate treating apparatus includes a housing having a treatment space for treating the substrate in the interior thereof, and a substrate pressing module configured to apply a force to a partial area of the substrate in the housing from the upper side, the substrate pressing module includes a support member configured to support the substrate, a weight member provided to be positioned on the partial area of the substrate positioned on the support member and having a specific weight or more, and a pressing unit configured to apply a force to the weight member from the upper side.

The pressing unit may include a protrusion provided above the weight member and protruding downwards to face the weight member, and a driving member configured to move at least one of the protrusion or the support member upwards and downwards between a spacing location and a pressing location, the spacing location may be a location at which the protrusion and the weight member are spaced apart from each other along an upward/downward direction, and the pressing location may be a location at which a lower end of the protrusion and an upper surface of the weight member contact each other such that a force is applied to the upper surface of the weight member by the protrusion.

The housing may include a lower housing, and an upper housing provided above the lower housing and combined with the lower housing to define the treatment space, the protrusion may be fixed to the upper housing, the driving member may move the support member upwards and downwards, and a side wall of the lower housing may surround the support member.

The lower housing may close a treatment space together with the upper housing when the lower housing is coupled to the support member to be moved upwards and downwards by the driving member and the support member is located at the pressing location.

The partial area may be a peripheral area of the substrate, the weight member may have a ring shape, a bottom surface of which faces the partial area, the substrate pressing module may further include an adapter member provided between the protrusion and the support member from the outside in a state in which the substrate is positioned, the adapter member may include a ring-shaped body, an inner diameter of which is greater than the diameter of the substrate, three or more support pins protruding inwards from the body and provided along a circumferential direction of the body, a step protruding inwards may be provided at a lower end of an inner surface of the body, an outer diameter of the weight member may be greater than an inner diameter of the step and is smaller than a diameter of the inner surface of the body, the substrate may be positioned on the support pins, the step may be provided such that the weight member is positioned on the substrate, and the support member may have a diameter that is smaller than the inner diameter of the body and is equal to or greater than the diameter of the substrate and insertion recesses, into which the support pins are inserted downwards, may be formed on the upper surface of the support member.

The body may be provided to face a lower end of a side wall of the upper housing and an upper end of a side wall of the lower housing, and the body may close the treatment space at the pressing location as an upper surface of the body contacts a lower end of the side wall of the upper housing and a bottom surface of the body contacts an upper end of the side wall of the lower housing.

The inventive concept provides a method for pressing a substrate by applying a force to a partial area of the substrate from the upper side by using the substrate pressing module. The method includes a substrate providing operation of providing the substrate into the substrate pressing module, a weight member providing operation of positioning the weight member on the substrate, and a pressing operation of, thereafter, applying a force to the weight member from the upper side by using the pressing unit.

The pressing unit may include a protrusion provided above the weight member and protruding downwards to face the weight member, and the pressing operation may include lifting the support member from the upper side to a pressing location at which a force is applied by the protrusion, by the weight member, in a state in which the substrate is positioned on the support member and the weight member is positioned on the substrate.

The partial area may be a peripheral area of the substrate, the weight member may have a ring shape, a bottom surface of which faces the partial area, the substrate pressing module may further include an adapter member provided such that the substrate and the weight member are positioned on the adapter member, the adapter member may include a ring-shaped body, an inner diameter of which is greater than the diameter of the substrate, and three or more support pins protruding inwards from the body and provided along a circumferential direction of the body, a step protruding inwards may be provided at a lower end of an inner surface of the body, an outer diameter of the weight member may be greater than an inner diameter of the step and is smaller than a diameter of the inner surface of the body, the support member may have a diameter that is smaller than the inner diameter of the body and is equal to or greater than the diameter of the substrate and insertion recesses, into which the support pins are inserted downwards, are formed on the upper surface of the support member, and the substrate providing operation may include an operation of providing the adapter member on which the substrate is positioned on the support pins between the support member and the protrusion.

The weight member providing operation may include an operation of positioning the weight member on the adapter member on which the substrate is positioned.

The pressing operation may include an operation of lifting the support member to the pressing location such that the support member passes through the interior of the body.

The inventive concept provides a method for treating a substrate by using the substrate treating apparatus. The substrate treating apparatus includes a substrate pressing operation of applying a force to the partial area of the substrate from the upper side by using the substrate pressing module, and a substrate treating operation of performing a process of treating the substrate. The substrate pressing operation includes a substrate providing operation of providing the substrate into the substrate pressing module, a weight member providing operation of positioning the weight member on the substrate, and a pressing operation of, thereafter, applying a force to the weight member from the upper side by using the pressing unit. The substrate providing operation may include an operation of providing the adapter member on which the substrate is positioned on the support pins between the support member and the protrusion, the weight member providing operation may include an operation of positioning the weight member on the adapter member, on which the substrate is positioned, and the pressing operation may include an operation of lifting the support member and the lower housing to the pressing location such that the support member and the lower housing pass through the interior of the body.

The substrate treating operation may be performed in a state in which the support member is located at the pressing location through the pressing operation.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

A substrate treating apparatus 10 according to an embodiment of the inventive concept is an apparatus that performs a process of treating a substrate. The substrate treating apparatus 10 may be various kinds of apparatuses that perform a process for a substrate. For example, the substrate treating apparatus 10 may be an apparatus that performs a photographing process, an etching process, a deposition process, or a heat treating process.

The substrate 20 treated by the substrate treating apparatus 10 of the inventive concept may be a semiconductor wafer, a mask, or a liquid crystal display (LCD) panel.

Figure 1:
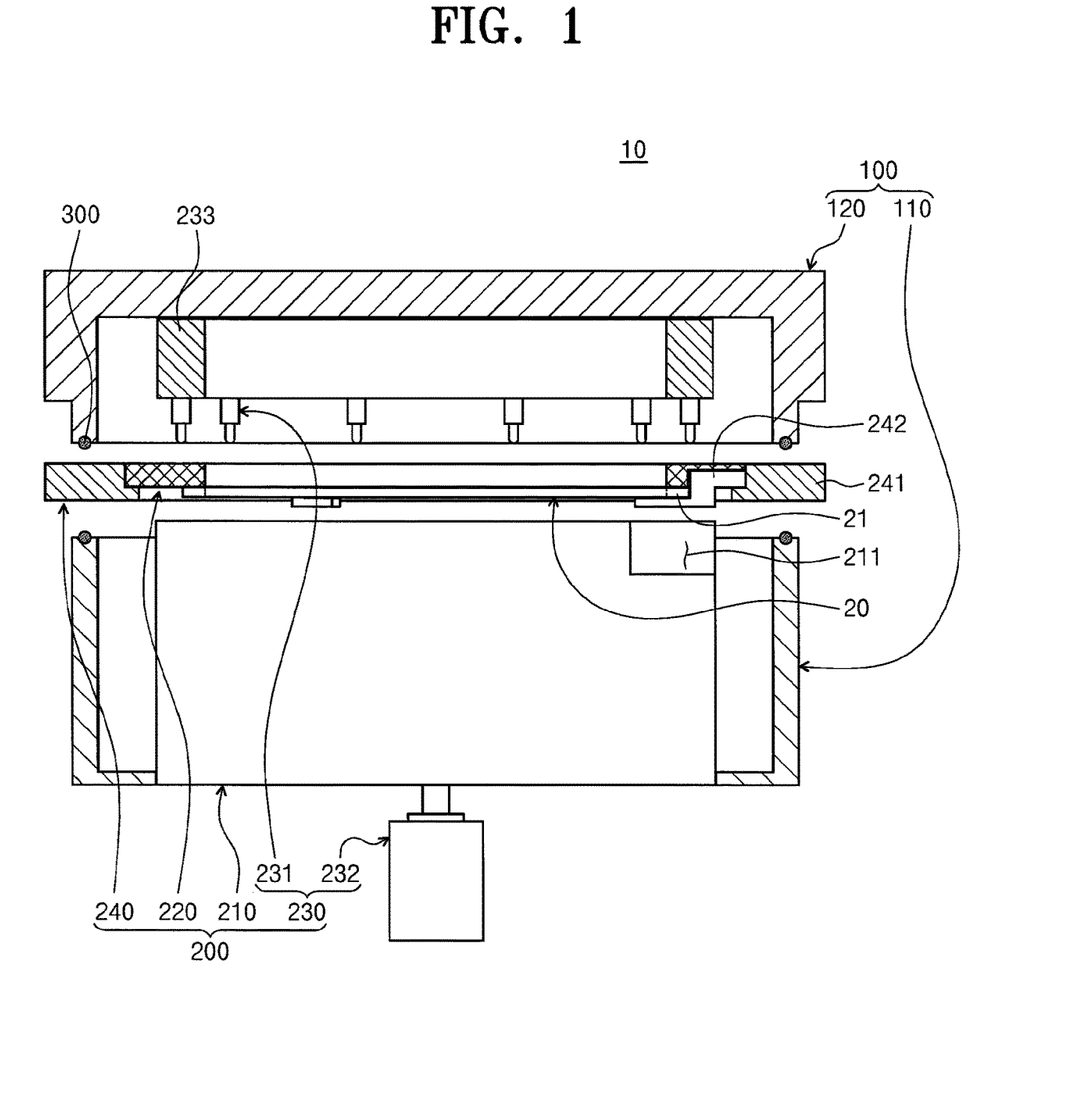
FIG. 1 is a sectional view illustrating a spacing location of a substrate treating apparatus according to an embodiment of the inventive concept.
Figure 2:
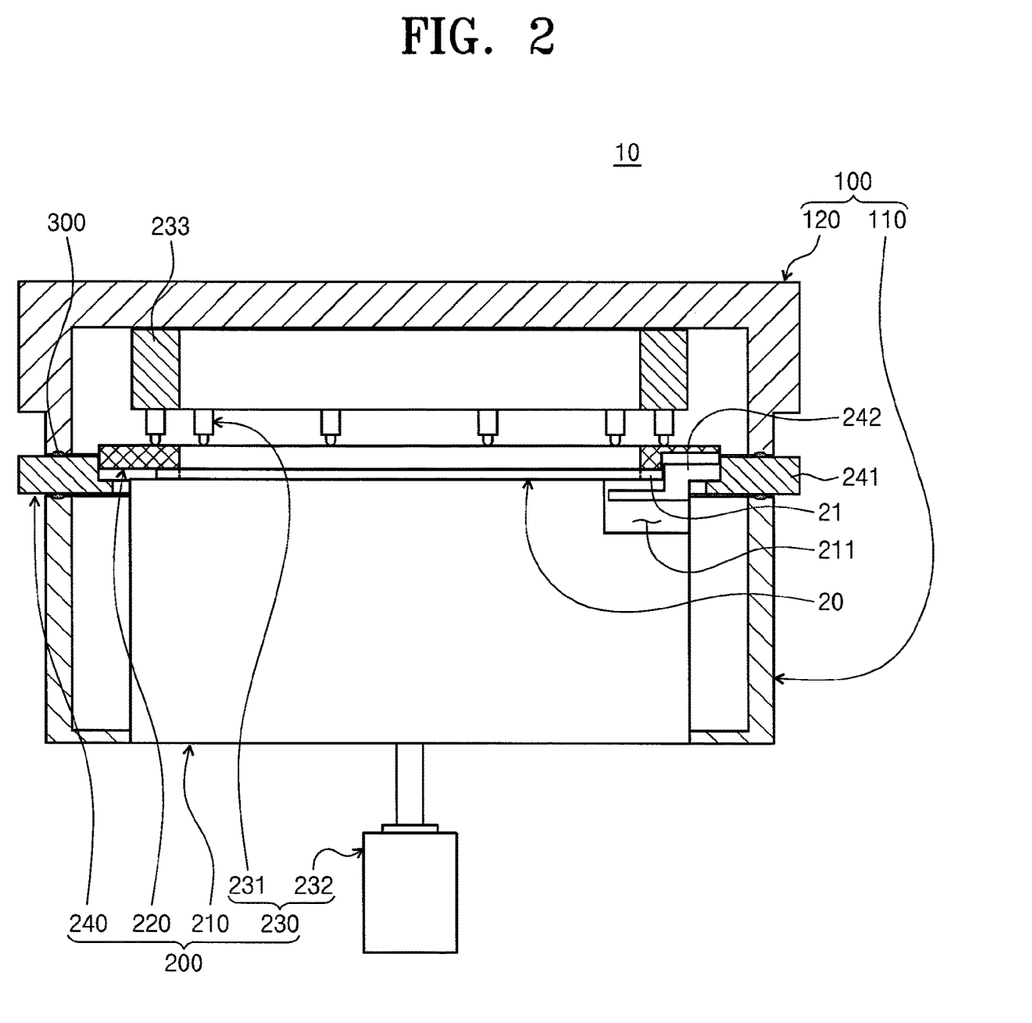
FIG. 2 is a sectional view that the substrate treating apparatus of FIG. 1 is located at a pressing location.

FIG. 1 is a sectional view illustrating a spacing location of a substrate treating apparatus 10 according to an embodiment of the inventive concept. FIG. 2 is a sectional view that the substrate treating apparatus 10 of FIG. 1 is located at a pressing location. Referring to FIGS. 1 and 2, the substrate treating apparatus 10 includes a housing 100 and a substrate pressing module 200.

The housing 100 has a treatment space, in which a substrate 20 is treated, in the interior thereof. According to an embodiment, the housing 100 includes a lower housing 110 and an upper housing 120.

The lower housing 110 is provided such that a side wall thereof surrounds a support member 210. According to an embodiment, the lower housing 110 is coupled to the support member 210 to be moved upwards and downwards together with the support member 210 by a driving member 232. In this case, when the support member 210 is located at the pressing location, it closes the treatment space together with the upper hosing 120. In this case, an upper surface of the support member 210 may be located at a location that is higher than an upper end of a side wall of the lower housing 110 such that the weight member 220 and the substrate 20 may be spaced upwards apart from the adapter member 240 to apply a force to the protrusion 231 at the pressing location. Unlike this, the lower housing 110 may be provided to be moved upwards and downwards independently from the support member 210. In this case, the lower housing 110 may open or close the treatment space as it is lifted or lowered independently from the support member 210.

The upper housing 120 is provided above the lower housing 110. The upper housing 120 is combined with the lower housing 110 to define the treatment space 412 therebetween.

Various configurations that are required for treatment of a substrate may be provided according to the kinds of the substrate treating processes performed by the substrate treating apparatus 10 in the interiors of the upper housing 120 and the lower housing 110, in addition to the substrate pressing module 200 that will be described below. For example, when the substrate treating apparatus 10 is an apparatus for treating a substrate 20 by using plasma, the upper housing 120 is provided with a configuration of providing gas into the treatment space and a configuration of converting the gas into plasma, and the lower housing 110 is provided with a configuration of exhausting gas and plasma in the interior of the treatment space.

The substrate pressing module 200 applies a force to a partial area 21 of the substrate 20 in the housing 100 from the upper side. According to an embodiment, the substrate pressing module 200 includes a support member 210, a weight member 220, a pressing unit 230, and an adapter member 240. The partial area 21 may be an area, in which a warpage has already been generated or a warpage is expected to be generated during a substrate treating process. According to an embodiment, the partial area 21 may be a peripheral area of the substrate 20.

Figure 3:
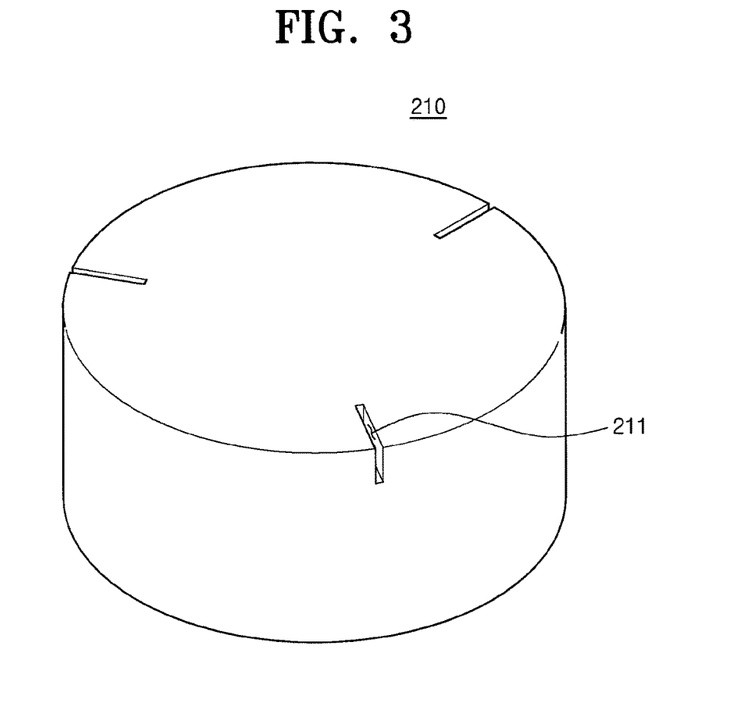
FIG. 3 is a perspective view illustrating a support member of FIG. 1.

FIG. 3 is a perspective view illustrating a support member 210 of FIG. 1. Referring to FIGS. 1 to 3, the support member 210 supports a substrate 20. According to an embodiment, the support member 210 may be provided to have a diameter that smaller than the inner diameter of the body 241 and is equal to or greater than the diameter of the substrate 20, which will be described below. Accordingly, the support member 210 may be moved upwards and downwards through an inner hole of the body 241. According to an embodiment, an insertion recess 211 is formed on the upper surface of the support member 210. The insertion recess 211 is provided such that a support pin 242, which will be described below, may be inserted into the insertion recess 211 downwards. Accordingly, when the support member 210 is lifted, the support member 210 is prevented from being interfered by the support pin 242.

Figure 4:
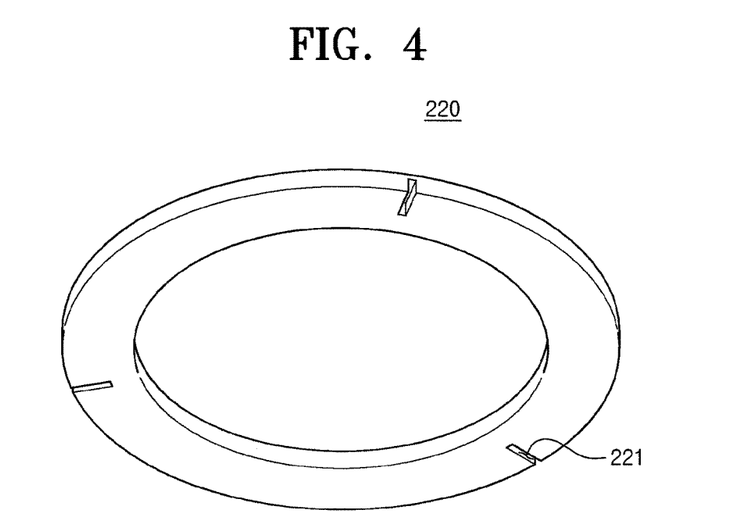
FIG. 4 is a perspective view illustrating a weight member of FIG. 1.

FIG. 4 is a perspective view illustrating a weight member 220 of FIG. 1. Referring to FIGS. 1, 2, and 4, the weight member 220 is provided to be positioned on the partial area 21 of the substrate 20 positioned on the support member 210. According to an embodiment, when the substrate 20 has a disk shape and a partial area 21 of the substrate 20 is a peripheral area of the substrate 20, the weight member 220 may have a ring shape such that a bottom surface thereof faces the partial area 21.

The weight member 220 is provided to have a specific weight or more. The specific weight may be provided differently if necessary. For example, the weight member 220 may be provided to be heavier when a stronger force is required to be applied to the substrate 20 positioned on the support member 210 at a pressing location according to a state of the substrate 20 or a deformation degree of the substrate 20 that is expected during a process. Unlike this, when a weaker force is required to be applied to the substrate 20 positioned on the support member 210 at the pressing location, the weight member 220 may be provided to be lighter. However, there is a limit in increasing the weight of the weight member 220 due to a spatial limit of the treatment space and a limit of the material of the weight member 220.

An area of the bottom surface of the weight member 220 is provided differently if necessary. For example, the area of the bottom surface of the weight member 220 is provided to correspond to the extent of an area of the substrate 20, in which a warpage has already been generated or is expected to be generated. According to an embodiment, because the substrate 20 generally has a disk shape and a warpage is mainly generated in a peripheral area 21 of the substrate 20, a distance between an inner diameter and an outer diameter of the weight member 220 may become different according to the extent of the peripheral area 21, in which a warpage of the substrate 20 has already been generated or is expected to be generated, when the weight member 220 has a ring shape as illustrated.

The pressing unit 230 applies a force to the weight member 220 from the upper side. According to an embodiment, the pressing unit 230 includes a protrusion 231 and a driving member 232.

Figure 5:
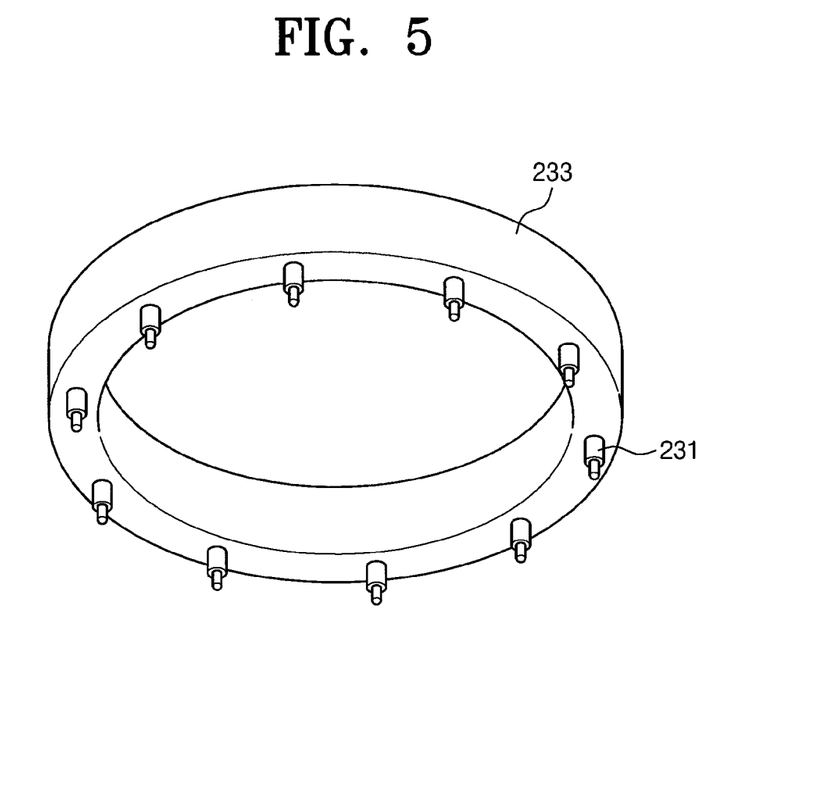
FIG. 5 is a perspective view illustrating a protrusion and a frame of FIG. 1.

FIG. 5 is a perspective view illustrating a protrusion 231 and a frame 233 of FIG. 1. Referring to FIGS. 1, 2, and 5, the protrusion 231 is provided above the weight member 220. The protrusion 231 is provided to protrude downwards to face the weight member 220. A plurality of protrusions 231 may be provided. Accordingly, according to an embodiment, when the substrate 20 and the weight member 220 have ring shapes, the plurality of protrusions 231 may be combined with each other to form a ring shape along a circumferential direction of the weight member 220. In this case, the protrusions 231 may be fixed to the bottom surface of the frame 233 having a ring shape, which is provided to be fixed to the interior of the upper housing 120.

Figure 6:
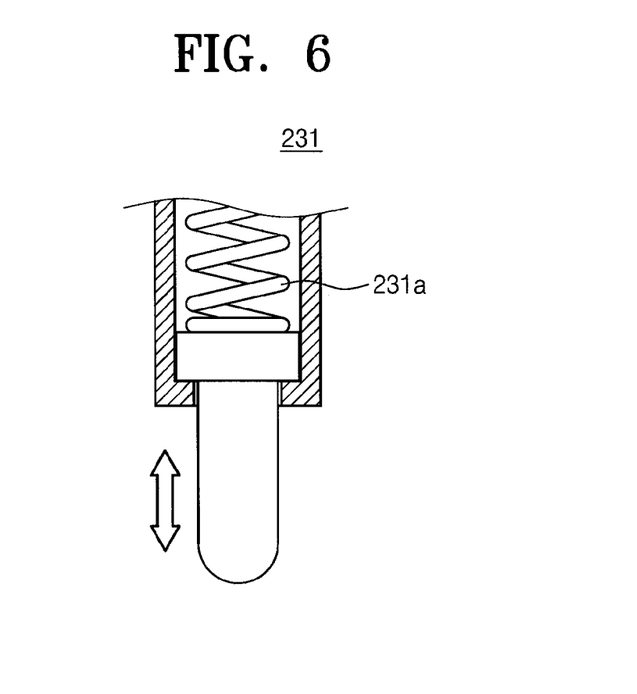
FIG. 6 is a sectional view illustrating the protrusion of FIG. 5.

FIG. 6 is a sectional view illustrating the protrusion 231 of FIG. 5. Referring to FIG. 6, the protrusion 231 may be a spring plunger. Accordingly, because the weight member 220 may be moved upwards while a lower end of the protrusion 231 applies a force to the weight member 220 due to the elasticity of the spring 231a at a pressing location, the weight member 220 or the substrate 20 is prevented from being damaged by an excessive force applied to the weight member 220. The elasticity of the spring 231a may be differently provided if necessary. For example, the spring 231a may have a stronger elastic force when a stronger force is required to be applied to the substrate 20 positioned on the support member 210 at a pressing location according to a state of the substrate 20 or a deformation degree of the substrate 20 that is expected during a process. Unlike this, when a weaker force is required to be applied to the substrate 20 positioned on the support member 210 at the pressing location, the spring may be a spring having a weaker elasticity. Further, the number of the protrusions 231 may be differently provided if necessary. When a force applied to the substrate 20 has to be increased, the number of the provided protrusions 231 may be increased. Unlike this, when a force applied to the substrate 20 has to be decreased, the number of the provided protrusions 231 may be decreased.

Referring to FIGS. 1 and 2 again, the driving member 232 moves at least one of the protrusion 231 or the support member 210 upwards and downwards between the spacing location and the pressing location. The spacing location is a location at which the protrusion 231 and the weight member 220 are spaced apart from each other in an upward/downward direction. The pressing location is a location at which the lower end of the protrusion 231 and the upper surface of the weight member 220 contact each other such that a force is applied to the upper surface of the weight member 220 by the protrusion 231. It has been described as an embodiment in the specification that the protrusion 231 is fixed to a specific location and the driving member 232 moves the support member 210 upwards and downwards. Unlike this, the driving member 232 is provided to move the protrusion 231 and fix the support member 210 at a specific location. In this case, an adapter member 240 that may provide the substrate 20 and the weight member 220 between the support member 210 and the protrusion 231, which will be described below, is not provided but the substrate 20 is directly provided on the upper surface of the support member 210, and the weight member 220 may be directly provided on the substrate 20. Unlike this, the driving member 232 may move the protrusion 231 and the support member 210 upwards and downwards between the spacing location and the pressing location in a state in which the adapter member 240, on which the substrate 20 and the weight member 220 are positioned, is provided between the protrusion 231 and the support member 210.

Figure 7:
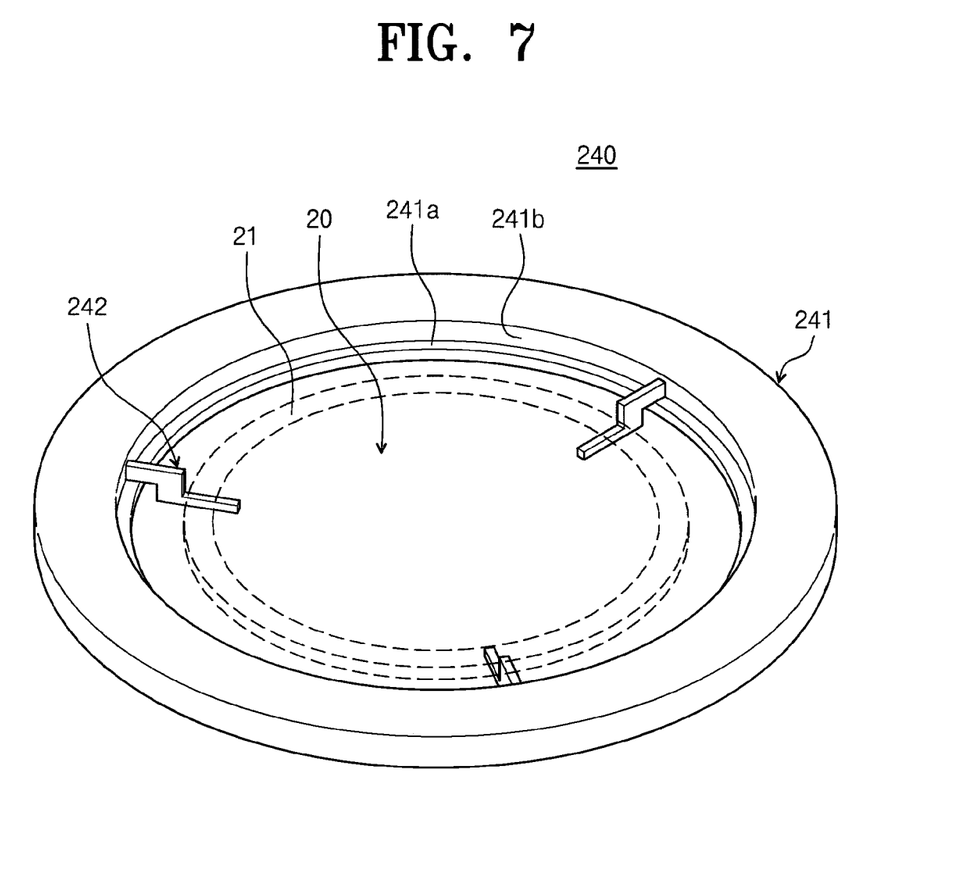
FIG. 7 is a perspective view illustrating an adapter member of FIG. 1.

FIG. 7 is a perspective view illustrating an adapter member 240 of FIG. 1. Referring to FIGS. 1, 2, and 7, the adapter member 240 is provided between the protrusion 231 and the support member 210 from the outside while the substrate is positioned. Because the feeding apparatus that feeds the substrate 20 may not directly grip the substrate 20 as the substrate 20 is provided to be moved together with the adapter member 240 in a state in which the substrate 20 is positioned on the adapter member 240, damage to the substrate 20 due to the gripping may be prevented. Accordingly, the substrate 20 may be easily fed. Further, the adapter member 240 may be provided to support the weight member 220 on the substrate 20. Accordingly, the weight member 220 may be easily located between the protrusion 231 and the support member 210 on the substrate 20. According to an embodiment, the adapter member 240 includes a body 241 and a support pin 242.

The body 241 has a ring shape, an inner diameter of which is greater than the diameter of the substrate 20. A step 241a protruding inwards is provided at a lower end of the inner surface of the body 241. The step 241a may be provided such that the weight member 220 may be positioned on the substrate 20. According to an embodiment, the outer diameter of the weight member 220 may be greater than the inner diameter of the step 241a and is smaller than the diameter of the inner surface of the body 241. As the step 241a that may support the weight member 220 is provided, the height, by which the weight member 220 is lowered, may be limited. Accordingly, the substrate 20 may be prevented from being damaged when the weight member 220 is excessively lowered. Further, according to an embodiment, because the holes formed by the outer surface of the weight member 220 and the inner surface of the body 241 are engaged with each other, the weight member 220 may be guided by the inner surface of the body 241 such that the weight member 220 may be properly located on the substrate 20 positioned on the support pins 242.

The support pins 242 are provided such that the substrate 20 may be supported by the holes formed by the inner surface of the body 241. According to an embodiment, the support pins 242 are provided to protrude from the body 241 inwards. Three or more support pins 242 are provided along a circumferential direction of the body 241.

According to an embodiment, when the adapter member 240, on which the substrate 20 is positioned, is provided between the protrusion 231 and the support member 210, the body 241 is provided to face a lower end of a side wall of the upper housing 120 and an upper end of a side wall of the lower housing 110. Accordingly, at the pressing location, the body 241 may be provided such that the upper surface of the body 241 contacts the lower end of the side wall of the upper housing 120 and the bottom surface of the body 241 contacts the upper end of the side wall of the lower housing 110 to close the treatment space. Sealing members 300 may be provided to the lower end of the side wall of the upper housing 120 and the upper end of the side wall of the lower housing 110. For example, the sealing members 300 may be O-rings of a resin material that are provided at the lower end of the side wall of the upper housing 120 and the upper end of the side wall of the lower housing 110, respectively.

Figure 8:
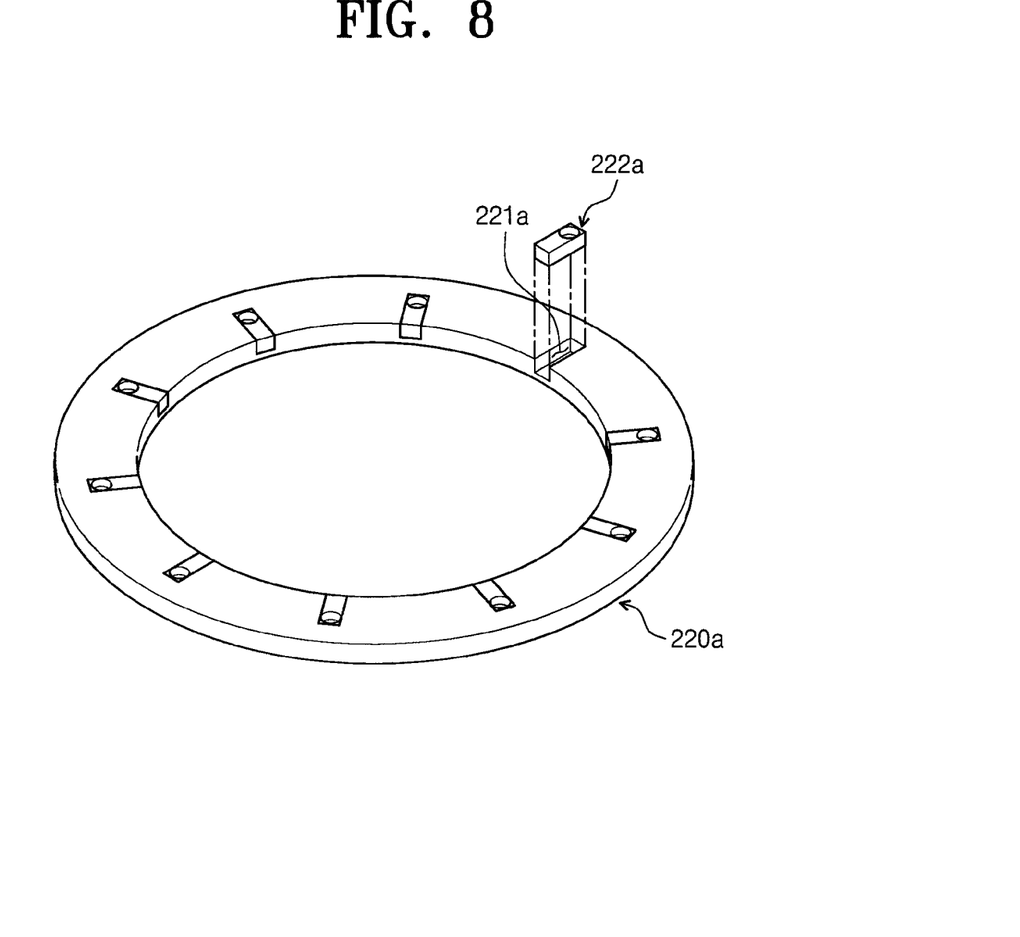
FIG. 8 is a perspective view illustrating a weight member according to an embodiment of the inventive concept.
Figure 9:
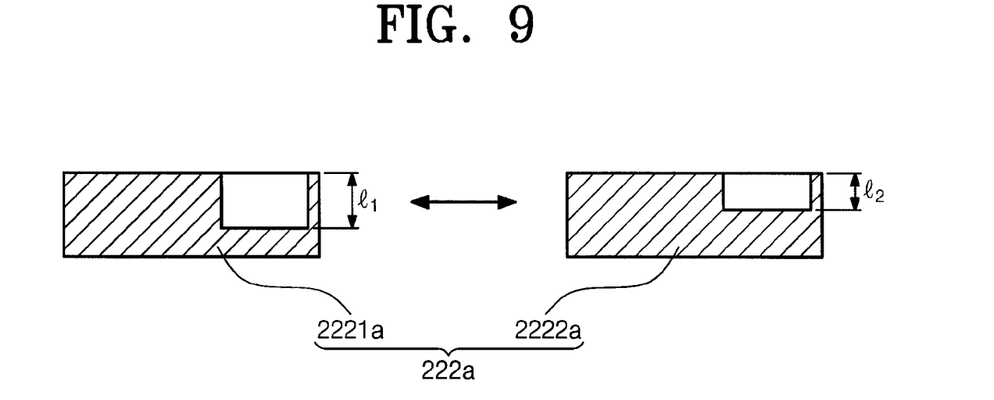
FIG. 9 is a sectional view illustrating a depth adjusting member of FIG. 8.

FIG. 8 is a perspective view illustrating a weight member 220a according to an embodiment of the inventive concept. FIG. 9 is a sectional view illustrating a depth adjusting member 222a of FIG. 8. Referring to FIGS. 8 and 9, unlike the case of FIG. 4, an adjustment recess 221a that is recessed inwards is formed in an area including a facing area that faces the protrusion 231 of the upper surface of the weight member 220a. A depth adjusting member 222a is inserted into the adjustment recess 221a to be engaged with the adjustment recess 221a.

According to an embodiment, the bottom surface of the corresponding area is higher than a lower end of the spring plunger in a state in which the spring plunger provided as the protrusion 231 is extended maximally at the pressing location and is lower than the height of the upper surface of the weight member 220a. A plurality of depth adjusting members 222a are provided to be replaced with each other and such that the heights of the corresponding areas corresponding to the facing areas in a state in which the depth adjusting members 222a are the adjustment recesses 221a are different. For example, the depth adjusting member 222a includes a first adjusting member 2221a and a second adjusting member 2222b that are provided in the adjustment recesses 221a to be replaced with each other. The heights 11 and 12 of the corresponding areas of the first adjusting members 2221a and the second adjusting member 2222a are provided to be different in a state in which they are inserted into the adjustment recesses 222a. Accordingly, because a contraction degree of the spring 231a of the plunger varies according to the height of the corresponding area of the depth adjusting member 222a at the pressing location when the protrusion 231 is the spring plunger, a force applied to the substrate 20 at the pressing location may be adjusted by replacing the depth adjusting members 222a, the heights of the corresponding areas of which are different. According to an embodiment, the adjustment recesses 221a may extend to the inner surface of the weight member 220a. Further, the depth adjusting members 222a have shapes, the heights of the corresponding areas of which are lower than the heights of the areas, except for the corresponding areas. For example, the corresponding areas correspond to circular recesses that are recessed downwards on the upper surfaces of the depth adjusting members 222a.

Figure 10:
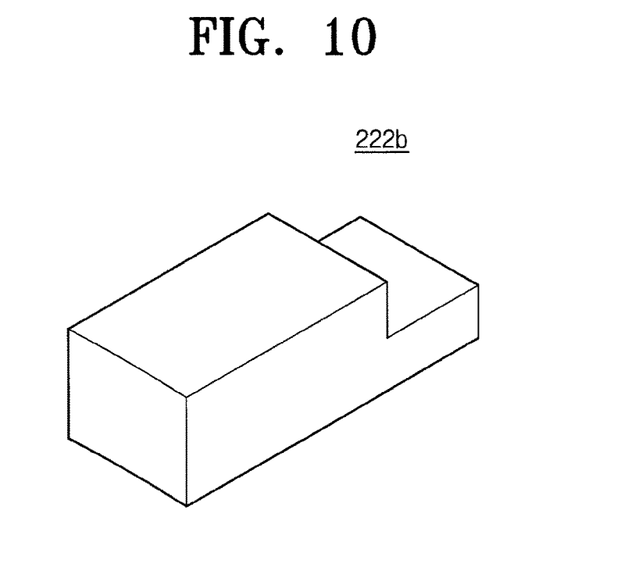
FIG. 10 is a perspective view illustrating a depth adjusting member according to another embodiment.

FIG. 10 is a perspective view illustrating a depth adjusting member 222b according to another embodiment. Unlike the case of FIG. 9, referring to FIG. 10, the depth adjusting member 222b may have a shape in which an area on one side thereof including a corresponding area corresponding to the protrusion 231 is stepped to be lower than an opposite area thereof. Unlike this, the depth adjusting members inserted into the adjusting recesses 221a may have various shapes, by which the heights of the corresponding area thereof may be adjusted.

Hereinafter, a method for treating a substrate by using the substrate treating system 10 of FIG. 1 according to an embodiment of the inventive concept will be described.

Figure 11:
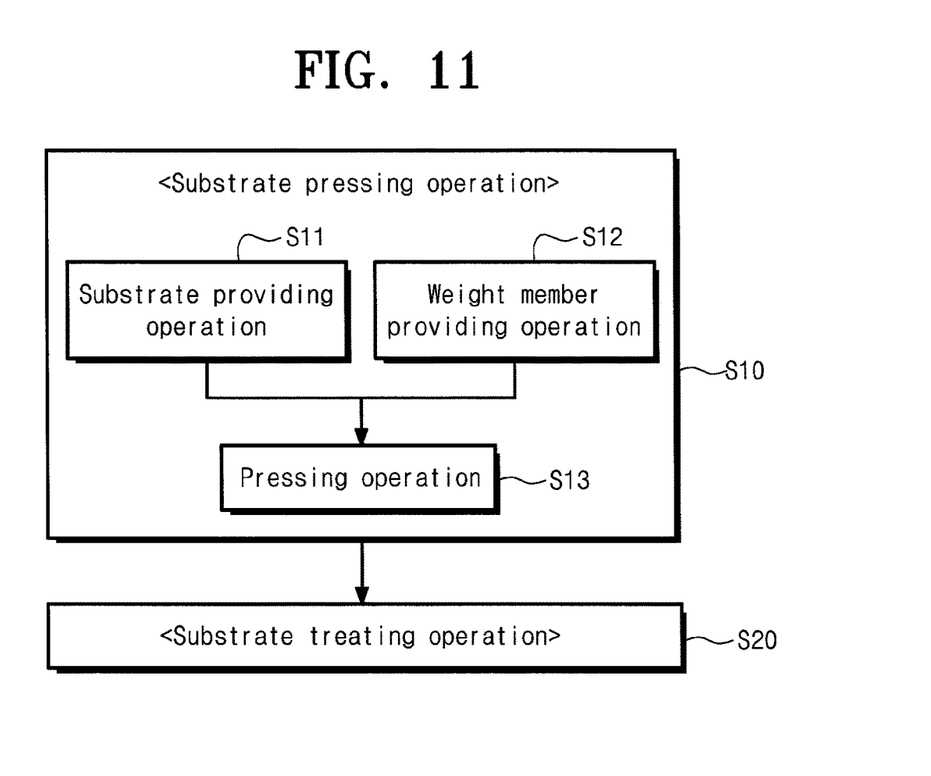
FIG. 11 is a flowchart illustrating a substrate treating method according to an embodiment of the inventive concept.

FIG. 11 is a flowchart illustrating a substrate treating method according to an embodiment of the inventive concept. Referring to FIGS. 1, 2, and 11, the substrate treating method includes a substrate pressing operation S10 and a substrate treating operation S20.

In the substrate pressing operation S10, the substrate pressing module 200 applies a force to a partial area 21 of the substrate 20 from the upper side. According to an embodiment, the substrate pressing operation S10 includes a substrate providing operation S11, a weight member providing operation S12, and a pressing operation S13.

In the substrate providing operation S11, a substrate is provided into the substrate pressing module 200. According to an embodiment, in the substrate providing operation S11, the adapter member 240, on which the substrate 20 is positioned on the support pins 242, is provided between the support member 210 and the protrusion 231.

In the weight member providing operation S12, the weight member 220 is positioned on the substrate 20 positioned on the support pins 242. According to an embodiment, in the weight member providing operation S12, the weight member 220 is positioned on the adapter member 240, on which the substrate 20 is positioned. The weight member providing operation S12 is performed before the pressing operation S13, and is performed before or after the substrate providing operation S11. That is, the weight member 220 may be positioned on the adapter member 240 before the pressing operation S13 is performed after the weight member 220 is provided into the substrate treating apparatus 10 together with the adapter member 240 in a state in which the weight member 220 is positioned on the adapter member 240, on which the substrate 20 is positioned outside the substrate treating apparatus 10 or the adapter member 240, on which the substrate 20 is positioned, is introduced into the substrate treating apparatus 10.

In the pressing operation S13, a force is applied to the weight member 220 from the upper side by using the pressing unit 230. According to an embodiment, in the pressing operation S13, a force is applying to the upper surface of the weight member 220 by the protrusion 231 as the support member 210 and the lower housing 110 are lifted to the pressing location after passing through the interior of the body 241 such that the lower end of the protrusion 231 and the upper surface of the weight member 220 contact each other. According to an embodiment, in this case, as described above, the lower housing 110 is lifted together with the support member 210 to close the treatment space.

In the substrate treating operation S20, a process of treating the substrate 20 is performed. The substrate treating operation S20 is performed in a state in which the support member 210 is located at the pressing location in the pressing operation S13. For example, in the substrate treating operation S20, various kinds of processes, such as an etching process, a deposition process, and a heat treating process, may be performed on the substrate 20 in a state in which the support member 210 is located at the pressing location.

As described above, according to the substrate pressing module 200, the substrate treating apparatus 10, the substrate pressing method, and the substrate treating method of the inventive concept, a warpage of a substrate may be prevented and improved by applying a force to the weight member 220 positioned on the substrate 20 positioned on the support member 210 from the upper side while the substrate 20 is treated and accordingly apply a force of the weight of the weight member 220 or more to the substrate 20 without increasing the weight of the weight member 220. Accordingly, according to the apparatuses and methods of the embodiments of the inventive concept, a defect rate of the substrate 20 may be minimized by uniformly transferring heat to the substrate 20 because the warpage of the substrate 20 is prevented and improved.

Further, according to the apparatuses and the methods of the embodiments of the inventive concept, a warpage of a substrate may be prevented and improved.

Further, according to the apparatuses and the methods of the embodiments of the inventive concept, heat may be uniformly transferred to the substrate.

Further, according to the apparatuses and the methods of the embodiments of the inventive concept, a defect of the substrate may be minimized.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate pressing module that applies a force to a partial area of a substrate, the substrate pressing module comprising:
   a support member configured to support the substrate;
   a weight member provided to be positioned on the partial area of the substrate positioned on the support member and having a specific weight or more; and
   a pressing unit configured to apply a force to the weight member,
   wherein the pressing unit comprises:
      a protrusion provided above the weight member and protruding downwards to face the weight member; and
      a driving member configured to move at least one of the protrusion or the support member upwards and downwards between a spacing location and a pressing location,
   wherein the spacing location is a location at which the protrusion and the weight member are spaced apart from each other along an upward/downward direction,
   wherein the pressing location is a location at which a lower end of the protrusion and an upper surface of the weight member contact each other such that a force is applied to the upper surface of the weight member by the protrusion,
   wherein the protrusion is fixed and the driving member moves the support member upwards and downwards.

2. The substrate pressing module of claim 1, wherein the partial area is a peripheral area of the substrate, and
   wherein the weight member has a ring shape, and a bottom surface of the weight member faces the partial area.

3. The substrate pressing module of claim 2, further comprising:
   an adapter member located between the protrusion and the support member,
   wherein the adapter member is provided to support the weight member on the substrate.

4. The substrate pressing module of claim 3, wherein the adapter member includes:
   a ring-shaped body, an inner diameter of the ring-shaped body being is greater than a diameter of the substrate; and
   three or more support pins protruding inwards from the body and provided along a circumferential direction of the body,
   wherein a step protruding inwards is provided at a lower end of an inner surface of the body,
   wherein an outer diameter of the weight member is greater than an inner diameter of the step and is smaller than a diameter of the inner surface of the body,
   wherein the substrate is positioned on the support pins,
   wherein the step is provided such that the weight member is positioned on the substrate, and
   wherein the support member has a diameter that is smaller than the inner diameter of the body and is equal to or greater than the diameter of the substrate and insertion recesses, into which the support pins are inserted downwards, are formed on the upper surface of the support member.

5. The substrate pressing module of claim 2, wherein a plurality of protrusions are combined with each other to form a ring shape along a circumferential direction of the weight member.

6. The substrate pressing module of claim 1, wherein the protrusion is a spring plunger.

7. The substrate pressing module of claim 6, wherein an adjustment recess is formed on the upper surface of the weight member,
   wherein a depth adjusting member is inserted into the adjustment recess.

8. The substrate pressing module of claim 7, wherein the adjustment recess is provided to extend to an inner surface of the weight member.

9. A substrate pressing module comprising:
   a support member configured to support a substrate;
   a weight member provided on a partial area of the substrate positioned on the support member; and
   a pressing unit configured to apply a force to the weight member,
   wherein the pressing unit comprises:
      a protrusion provided above the weight member and protruding downwards to face the weight member; and
      a driving member configured to move the protrusion or the support member upwards and downwards between a spacing location and a pressing location, wherein the spacing location is a location at which the protrusion and the weight member are spaced apart from each other in a vertical direction, wherein the pressing location is a location at which a lower end of the protrusion contacts with an upper surface of the weight member such that the protrusion applies a force to the upper surface of the weight member, wherein the substrate pressing module further comprises an adapter member located between the protrusion and the support member, and the adapter member supports the weight member on the substrate.

10. A substrate pressing module comprising:

a support member configured to support a substrate;

a weight member provided on a partial area of the substrate positioned on the support member; and a pressing unit configured to apply a force to the weight member, wherein the pressing unit comprises:

a protrusion provided above the weight member and protruding downwards to face the weight member; and a driving member configured to move the protrusion or the support member upwards and downwards between a spacing location and a pressing location, wherein the spacing location is a location at which the protrusion and the weight member are spaced apart from each other in a vertical direction, wherein the pressing location is a location at which a lower end of the protrusion contacts with an upper surface of the weight member such that the protrusion applies a force to the upper surface of the weight member, wherein the protrusion is a spring plunger.

* * * * *